United States Patent [19]
Takano et al.

[11] Patent Number: 5,296,730
[45] Date of Patent: Mar. 22, 1994

[54] SEMICONDUCTOR PRESSURE SENSOR FOR SENSING PRESSURE APPLIED THERETO

[75] Inventors: Osamu Takano; Koji Matsumi, both of Tokyo, Japan

[73] Assignee: Oki Electric Industry Co., Ltd., Tokyo, Japan

[21] Appl. No.: 680

[22] Filed: Jan. 5, 1993

[30] Foreign Application Priority Data

Jan. 16, 1992 [JP] Japan ........................... 4-005655

[51] Int. Cl.$^5$ .............................. A01L 29/66
[52] U.S. Cl. ............................. 257/417; 257/418; 257/419; 73/517 R; 73/721; 73/727; 437/901
[58] Field of Search ................. 257/417, 418, 419; 73/517 R, 720, 721, 726, 727; 437/901

[56] References Cited

U.S. PATENT DOCUMENTS

| | | | |
|---|---|---|---|
| 4,459,855 | 7/1984 | Yamagami | 73/727 |
| 4,672,354 | 6/1987 | Kurtz | 73/721 X |
| 4,773,972 | 9/1988 | Mikkor | 437/901 X |
| 4,885,621 | 12/1989 | Yoder et al. | 73/727 X |

FOREIGN PATENT DOCUMENTS

| | | | |
|---|---|---|---|
| 58-103635 | 6/1983 | Japan | 73/720 |
| 63-250865 | 10/1988 | Japan | 437/901 |
| 1-150832 | 6/1989 | Japan | 73/720 |
| 3-178172 | 8/1991 | Japan | |
| 2093272 | 8/1982 | United Kingdom | 437/901 |

*Primary Examiner*—William Mintel
*Attorney, Agent, or Firm*—Spencer, Frank & Schneider

[57] ABSTRACT

A semiconductor pressure sensor according to the present invention comprises a semiconductor substrate having a first surface, a second surface opposite to the first surface and a recess formed in the first surface, the recess defining an interior surface including a bottom surface; and a diffusion region extending from the adjacency of the bottom surface to the second surface. A pressure-sensitive resistance of the semiconductor pressure sensor is formed in the vicinity of the bottom surface of a diaphragm. Therefore, the pressure-sensitive resistance can be formed so as to be brought into alignment with the position of the diaphragm after the formation of the diaphragm. Accordingly, a semiconductor pressure sensor, which does not cause a displacement in position between the diaphragm and the pressure-sensitive resistance and is excellent in accuracy, can be easily fabricated. Further, since the pressure-sensitive resistance can be formed according to the shape of the diaphragm, the diaphragm can be reduced in size and fabricated in the form of a thin film.

5 Claims, 3 Drawing Sheets

SEMICONDUCTOR PRESSURE SENSOR FOR SENSING PRESSURE APPLIED THERETO

BACKGROUND OF THE INVENTION

1. Field of the Invention

The present invention relates to a semiconductor pressure sensor, and specifically to a semiconductor pressure sensor having a small diaphragm. This invention is also concerned with a fabrication process thereof.

2. Description of the Related Art

Semiconductor pressure sensors are used in various apparatuses such as automobiles and measuring instruments since their performance including sensitivity is excellent despite of their reduced size and weight.

A conventional pressure sensor is disclosed in the Japanese Laid-Open Patent Publication No. 3-178172 published on Aug. 2nd, 1991.

SUMMARY OF THE INVENTION

It is an object of the present invention to provide a semiconductor pressure sensor which can be fabricated on a smaller scale and provides less variations in pressure characteristics.

In order to achieve the above object, the semiconductor pressure sensor according to the present invention comprises a semiconductor substrate having a first surface, a second surface opposite to the first surface and a recess formed in the first surface, the recess defining an interior surface including a bottom surface; and a diffusion region extending from the adjacency of the bottom surface to the second surface.

As described above, a pressure-sensitive resistance of the semiconductor pressure sensor according to the present invention is formed in the vicinity of the bottom surface of a diaphragm. Therefore, the pressure-sensitive resistance can be formed in alignment with the position of the diaphragm after the formation of the diaphragm. It is thus possible to easily fabricate the semiconductor pressure sensor which does not cause a displacement in position between the diaphragm and the pressure-sensitive resistance and is excellent in accuracy Further, since the pressure-sensitive resistance can be formed according to the configuration of the diaphragm, the diaphragm can be reduced in size and shaped in the form of a thin film.

Further, a process for fabricating the above-mentioned semiconductor pressure sensor comprises the following steps of:

i) preparing a first semiconductor substrate having a first surface and a second surface opposite to the first surface;

ii) forming an insulating layer on the first surface of the first semiconductor substrate;

iii) forming a second semiconductor substrate on the insulating layer, the second semiconductor substrate having a third surface and a fourth surface opposite to the third surface, the insulating layer sandwiched between the first surface and the third surface;

iv) introducing an impurity in the first region in the fourth surface to form a first diffusion region;

v) forming a recess in the first semiconductor substrate to expose a second region in the third surface of the second semiconductor substrate; and vi) introducing the impurity to the second region to form a second diffusion region electrically connecting with the first diffusion region, wherein both the first diffusion region and the second diffusion region constitute the diffusion region extending from the third surface to the fourth surface.

Furthermore, according to an illustrative example described in the most suitable embodiment, the step of forming the above recess comprises the following steps of:

a) removing the material of the first semiconductor substrate to expose the insulating layer on the second region; and b) removing the insulating layer on the second region.

According to the fabrication process, a pressure-sensitive resistance layer is formed after the formation of a diaphragm. Therefore, transistors, which are to be formed in subsequent steps, are no longer contaminated with an alkaline etchant normally used upon formation of the diaphragm. Further, since the pressure-sensitive resistance layer is formed according to the size of the initially-formed diaphragm, a pressure-sensitive resistance is formed with high accuracy even if the diaphragm is reduced in size. As a result, a small-sized semiconductor pressure sensor, which does not develop variations in pressure characteristics, can be fabricated.

DETAILED DESCRIPTION OF THE PREFERRED EMBODIMENTS

Figure 1:
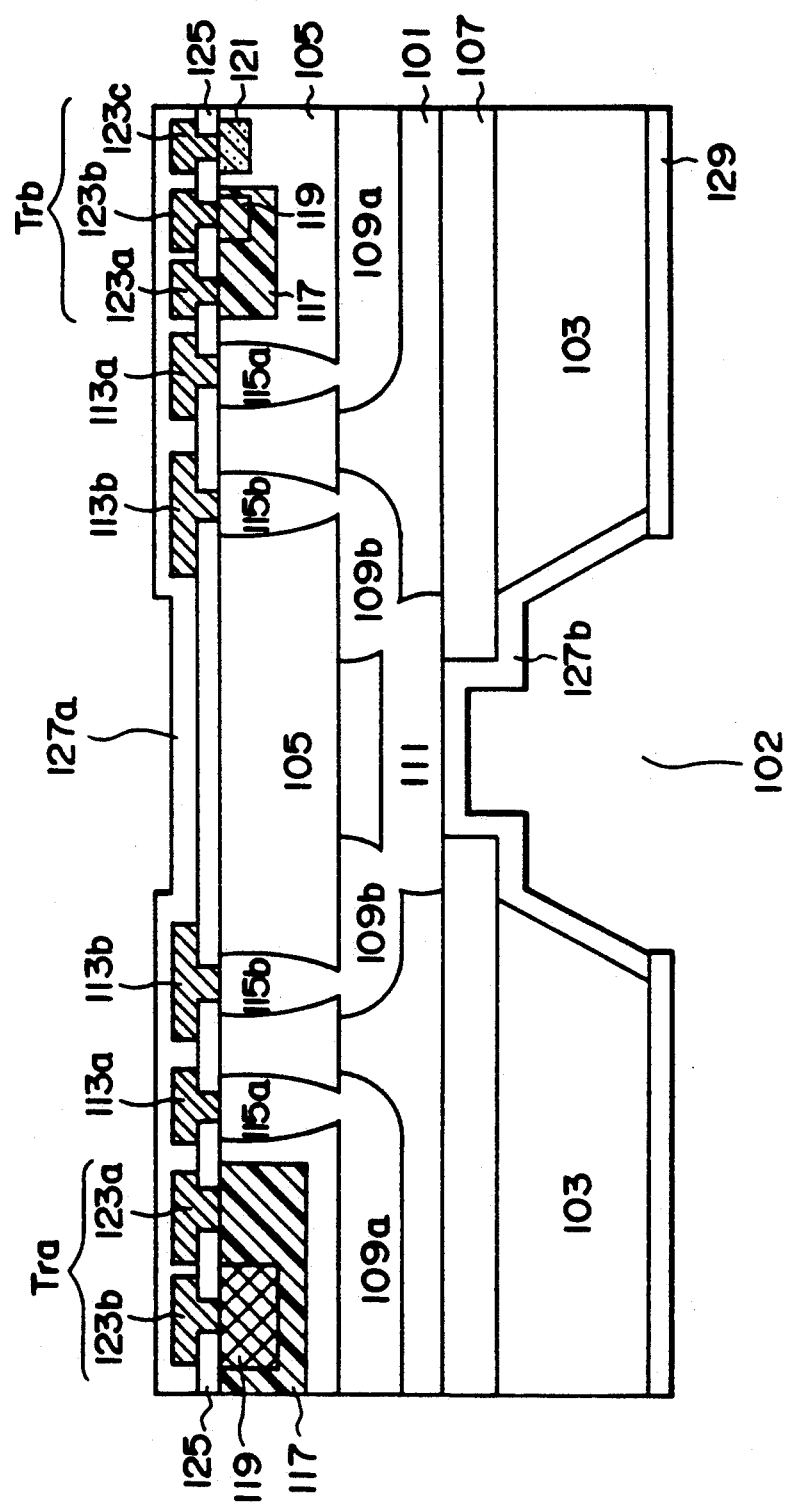
FIG. 1 is a cross-sectional view of the semiconductor pressure sensor according to the present invention.

FIG. 1 is a cross-sectional view showing a semiconductor pressure sensor according to the present invention.

The semiconductor pressure sensor comprises an n-type monocrystalline silicon substrate 101 having a (100) or (110) plane, an n-type or p-type monocrystalline silicon substrate 103 having a (100) or (110) plane, and epitaxial layers 105 fabricated on the n-type monocrystalline silicon substrate 101 and formed by epitaxially growing n-type monocrystalline silicon. A silicon dioxide film 107 is formed between the monocrystalline silicon substrate 101 and the monocrystalline silicon substrate 103. A recess formed in the monocrystalline silicon substrate 103 is a diaphragm of the semiconductor pressure sensor. The semiconductor pressure sensor referred to above can also be formed by using an SOI (Silicon on Insulator) substrate which can be obtained by epitaxially growing n-type monocrystalline silicon on the silicon dioxide film 107.

Isolation layers 109a for electrically isolating transistors from one another and buried lead layers 109b are formed on the surface of the monocrystalline silicon substrate 101 and in the vicinity of the surface thereof. Each of the buried lead layers 109b is electrically connected to a pressure-sensitive resistance layer 111 formed on the back surface of the monocrystalline silicon substrate 101 and in the vicinity of the surface thereof The isolation layers 109a, the buried lead layers 109b and the pressure-sensitive resistance layer 111 are respectively P-type impurity regions (hereinafter called "P+regions") obtained by diffusing boron (B) in high density or concentration The pressure-sensitive layer 111 is of a pressure-sensitive resistance used for the semiconductor pressure sensor, which detects stress applied to the diaphragm 102.

Isolation layers 115a (P+regions) for electrically connecting the isolation layers 109a to their corresponding conductive patterns 113a formed on the epitaxial layers 105, and buried lead layers 115b (P+regions) for electrically connecting the buried lead layers 109b to their corresponding conductive patterns 113b are respectively formed in the epitaxial layers 105. The isolation layers 115a (P+regions) and the buried lead layers 115b (P+regions) are formed by diffusing the boron using the ion implantation or thermal diffusion method. Further, transistors Tra, Trb for amplifying a signal responsive to a value detected by the pressure-sensitive resistance layer 111 are respectively formed on predetermined regions of the epitaxial layers 105. Each of the transistors Tra, Trb is of a bipolar type transistor having a base 117, an emitter 119 and a collector 121 (the collector of the transistor Tra is not shown). The bases 117, the emitters 119 and the collectors 121 of the respective transistors are respectively electrically connected to conductive patterns 123a, 123b and 123c through contact holes defined in oxide films 125.

A passivation film 127a for the protection of the respective transistors is formed on the epitaxial layers 105. Further, a passivation film 127b for protecting the pressure-sensitive resistance layer 111 and relaxing the stress applied to the diaphragm of the passivation film 127a is formed in the diaphragm 102. Such passivation films are silicon nitride films or silicon dioxide films. Moreover, the back surface of the monocrystalline silicon substrate 103 is covered by a silicon nitride film 129.

As described above, the pressure-sensitive resistance of the semiconductor pressure sensor according to the present invention is fabricated on the surface with the diaphragm formed thereon. Therefore, the pressure-sensitive resistance can be formed to be positionally aligned on the diaphragm after the diaphragm has been formed. It is thus possible to easily fabricate the semiconductor pressure sensor which does not cause a displacement in position between the diaphragm and the pressure-sensitive resistance and is excellent in accuracy. Further, since the pressure-sensitive resistance can be formed according to the shape of the diaphragm, the diaphragm can be reduced in size and shaped in the form of a thin film.

A method of fabricating the above semiconductor pressure sensor will now be described below with reference to FIGS. 2(A) through 2(F). In this case, the same elements of structure as those shown in FIG. 1 are identified by like reference numerals.

Figure 2A:
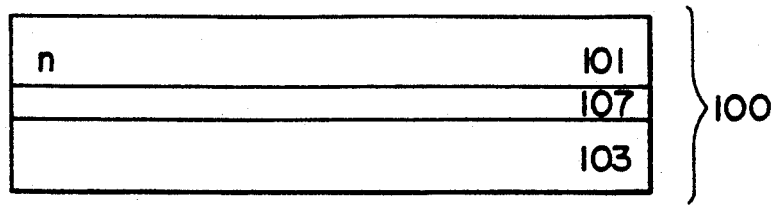
FIGS. 2(A) trough 2(F) are cross-sectional views showing various steps of a fabrication process according to the present invention.

As shown in FIG. 2(A), a silicon dioxide film 107 is formed on an n-type or p-type monocrystalline silicon substrate 103 (whose thickness is 400 μm to 500 μ) having a (100) or (110) plane. Further, an n-type monocrystalline silicon substrate 101 (which is 400 μm to 500 μm in thickness) having the (100) or (110) plane is formed on the silicon dioxide film 107, thereby forming a substrate 100 for the semiconductor pressure sensor. In this case, the substrate 100 may also be fabricated by melting the silicon dioxide films formed on the surfaces of the monocrystalline silicon substrate 103 and the monocrystalline silicon substrate 101 and bonding them to each other. Thereafter, the substrate 100 is optically polished until the thickness of the monocrystalline silicon substrate 101 is brought to a thickness range of 20 μm to 30 μm.

The substrate 100 for the semiconductor pressure sensor can also be fabricated by using the SOI (Silicon on Insulator) which can be formed by epitaxially growing the monocrystalline silicon on the silicon dioxide film.

Figure 2B:
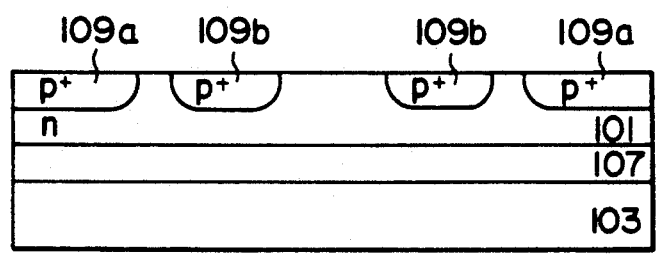

Next, as shown in FIGS. 2(B), isolation layers 109a (P+regions) and buried lead layers 109b (P+regions) are selectively formed in the polished surface of the monocrystalline silicon substrate 101 and in the vicinity thereof by diffusing, in high concentration, boron (B) which is a P-type impurity. The isolation layers 109a are used to electrically isolate transistors formed later from each other, whereas the buried lead layers 109b are electrically connected to a pressure-sensitive resistance layer formed later.

Figure 2C:
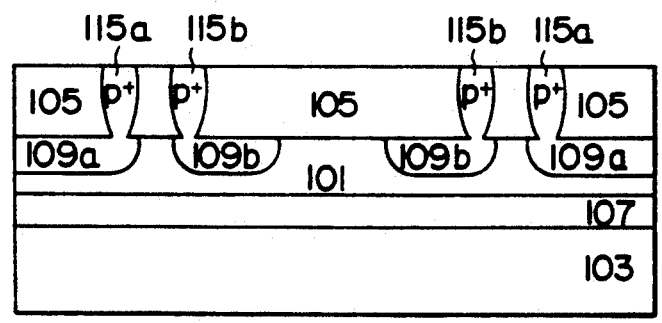

As illustrated in FIG. 2(C), n-type monocrystal-line silicon is then epitaxially grown on the monocrystalline silicon substrate 101 formed with the isolation layers 109a and the buried lead layers 109b, thereby forming epitaxial layers 105 each having a thickness of 8 μm to 9 μm. Thereafter, isolation layers 115a (P+regions) and buried lead layers 115b (P+regions) are selectively formed in the surfaces of the epitaxial layers 105 and in the vicinity thereof by diffusing the boron (B) in high concentration using the ion implantation or the thermal diffusion method.

Figure 2D:
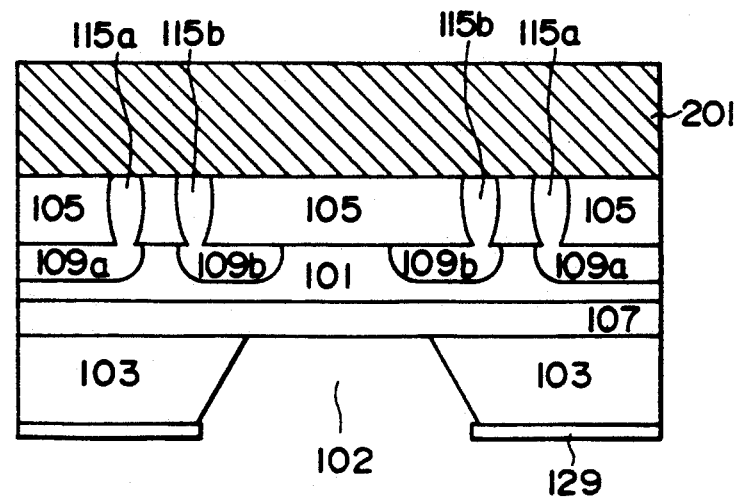

As shown in FIG. 2(D), a polysilicon layer 201 having a thickness of 100 μm or so is then formed on the epitaxial layers 105. The polysilicon layer 105 is used as a reinforcement layer for reinforcing the diaphragm because the thickness of the substrate 100 becomes thin when the diaphragm is formed later and the strength of the substrate 100 is weakened by the stress applied in subsequent steps. A silicon nitride film 129, which serves as an anisotropically-etched mask, is formed to a thickness of 2000 Å by a CVD (Chemical Vapor Deposition) process. Further, after the silicon nitride film 129 has been selectively removed, the monocrystalline silicon substrate 103 is anisotropically etched by using an alkaline etchant such as a solution of potassium hydroxide or the like according to the diaphragm to be formed from now. The anisotropic etching is stopped when the silicon dioxide film 107 is exposed. The silicon dioxide film 107 is not etched by the alkaline etchant, so that the etching can be effected with high accuracy by using the silicon dioxide film as a layer for stopping the etching. As a result, the diaphragm which does not cause variations in thickness, can be formed. The diaphragm 102 is formed in this way.

Figure 2E:
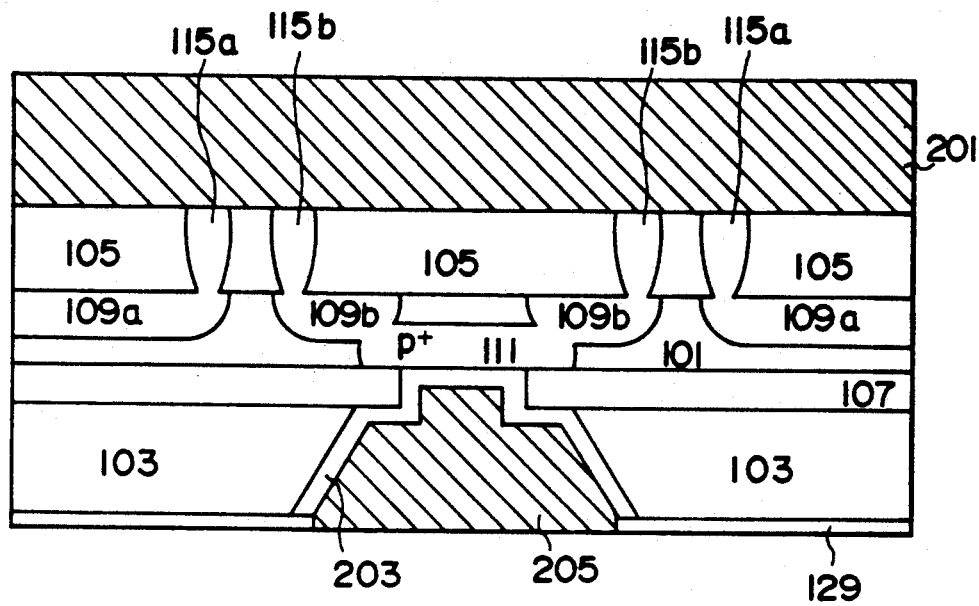

As shown in FIG. 2(E), the exposed silicon dioxide film 107 is selectively eliminated according to the pressure-sensitive resistance layer to be formed, thereby exposing a portion of the monocrystalline silicon substrate 101. Thereafter, the boron (B) is diffused over the exposed portion of the monocrystal-line silicon substrate 101 in high concentration, thereby forming a pressure-sensitive resistance layer 111. The pressure-sensitive resistance layer 111 is electrically connected to the buried lead layers 109b. At this time, when the sum of the depth of diffusion of the boron at the time that the pressure-sensitive resistance layer 111 is formed and the depth of diffusion of the boron at the time that the buried lead layers 109b are formed, is set to be greater than the thickness of the monocrystalline silicon substrate 101, the pressure-sensitive resistance layer 111 and the buried lead layers 109b are electrically connected to one another. In this case, a margin is taken in consideration of the electrical connection between the pressure-sensitive resistance layer 111 and the buried lead layers 109b when the buried lead layers 109b are formed. This margin is provided to reliably connect the pressure-sensitive resistance layer to the buried lead layers even if any displacement in positional alignment takes place upon formation of the diaphragm. Therefore, the buried lead layers 109b and the pressure-sensitive resistance layer 111 are reliably electrically connected to each other. The pressuresensitive resistance layer 111 serves as a pressuresensitive resistance used for the semiconductor pressure sensor, which senses the stress applied to the diaphragm 102. Thereafter, a silicon dioxide film 203 is formed within the diaphragm 102. A polysilicon layer 205 is formed on the silicon dioxide film 203 as a reinforcement layer for reinforcing the diaphragm, followed by elimination of the polysilicon layer 201.

Figure 2F:
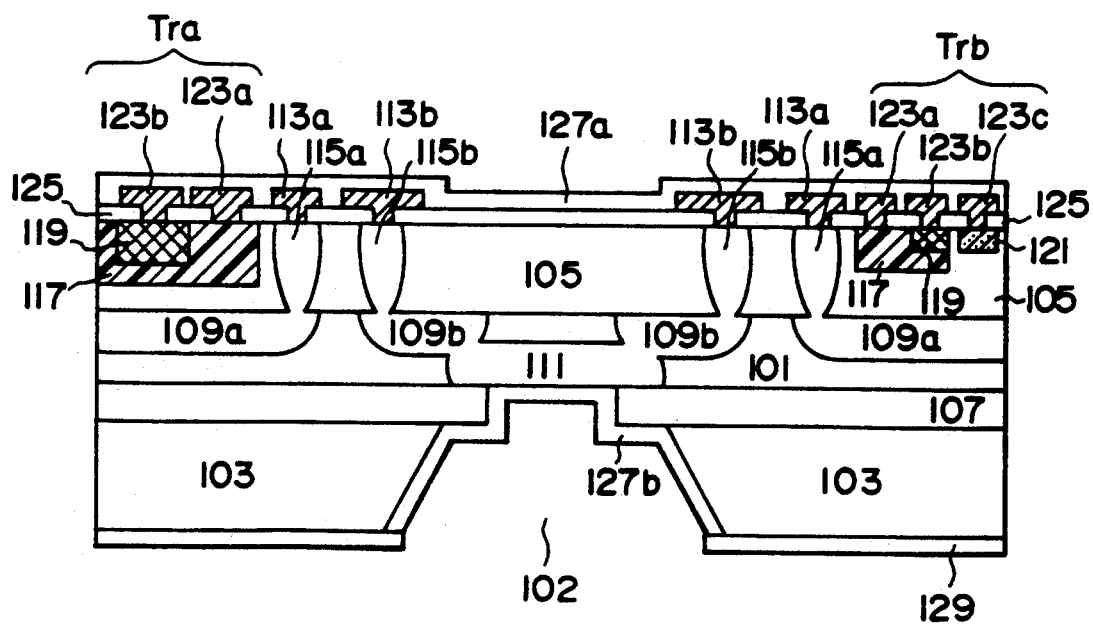

As shown in FIG. 2(F), transistors Tra, Trb are then fabricated onto predetermined regions of the epitaxial layers 105 by a known semiconductor process. Each of the transistors Tra, Trb is used to amplify a signal responsive to a value detected by the pressure-sensitive resistance layer 111. Each of the transistors Tra, Trb is of a bipolar type transistor having a base 117, an emitter 119 and a collector 121 (the collector of the transistor Tra is not shown). Thereafter, each of aluminum patterns 113, 123 is formed at a predetermined position. Further, a passivation film 127a is formed on the aluminum patterns to cover the entire substrate. Afterwards, the polysilicon layer 205 is removed and a passivation film 127b is formed within the diaphragm 102 by a plasma CVD process. The passivation film 127b is provided to relax the stress applied to the diaphragm 102 by the formation of the passivation film 127a. Such passivation films are of silicon nitride films or silicon dioxide films.

The semiconductor pressure sensor according to the present invention is constructed as described above.

According to the method of fabricating the semiconductor pressure sensor, a pressure-sensitive resistance layer is formed after the formation of a diaphragm. Therefore, transistors are no longer contaminated with an alkaline etchant used upon formation of the diaphragm. Further, since the pressure-sensitive resistance layer is formed according to the size of the initially-formed diaphragm, a pressure-sensitive resistance is formed with high accuracy even if the diaphragm is reduced in size. As a result, a small semiconductor pressure sensor, which does not develop variations in pressure characteristics, can be fabricated.

According to the present invention, as has been described above in detail, a semiconductor pressure sensor, which is excellent in accuracy and reduced in size, can be fabricated.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modification or embodiments as fall within the true scope of the invention.

What is claimed is:

1. A semiconductor pressure sensor comprising:
   a semiconductor substrate having a first surface, a second surface opposite the first surface and a recess formed in the first surface, the recess defining an interior surface including a bottom surface;
   a diffusion region formed in the semiconductor substrate extending from the bottom surface to the second surface; and
   a conductive layer formed on the second surface, electrically connected to the diffusion region.

2. The semiconductor pressure sensor according to claim 1, wherein the semiconductor substrate comprises a first semiconductor substrate, an insulating layer formed on the first semiconductor substrate and a second semiconductor substrate formed on the insulating layer, the first semiconductor substrate having the first surface and a third surface opposite to the first surface, the second semiconductor substrate having the second surface and a fourth surface opposite to the second surface, the insulating layer sandwiched between the third surface and the fourth surface, a portion of the fourth surface constituting the bottom surface.

3. The semiconductor pressure sensor according to claim 1, wherein said diffusion region forms a piezoresistor element.

4. A semiconductor pressure sensor comprising:
   a semiconductor substrate having a first surface, a second surface opposite to the first surface and a recess formed in the first surface, the recess defining an interior surface including a bottom surface;
   an impurity layer formed in the semiconductor substrate extending from the bottom surface to the second surface, wherein the impurity layer forms a piezoresistor element; and
   a conductive layer formed on the second surface, electrically connected to the diffusion region.

5. The semiconductor pressure sensor according to claim 4, wherein the semiconductor substrate comprises a first semiconductor substrate, an insulating layer formed on the first semiconductor substrate and a second semiconductor substrate formed on the insulating layer, the first semiconductor substrate having the first surface and a third surface opposite to the first surface, the second semiconductor substrate having the second surface and a fourth surface opposite the second surface, the insulating layer sandwiched between the third surface and the fourth surface, a portion of the fourth surface constituting the bottom surface.

* * * * *